(12) United States Patent
Van Slyke et al.

(10) Patent No.: US 6,797,314 B2
(45) Date of Patent: Sep. 28, 2004

(54) METHOD OF HANDLING ORGANIC MATERIAL IN MAKING AN ORGANIC LIGHT-EMITTING DEVICE

(75) Inventors: Steven A. Van Slyke, Pittsford, NY (US); Dilip K. Chatterjee, Rochester, NY (US); Syamal K. Ghosh, Rochester, NY (US); Donn B. Carlton, Hamlin, NY (US)

(73) Assignee: Eastman Kodak Company, Rochester, NY (US)

( * ) Notice: Subject to any disclaimer, the term of this patent is extended or adjusted under 35 U.S.C. 154(b) by 484 days.

(21) Appl. No.: 09/898,369

(22) Filed: Jul. 3, 2001

(65) Prior Publication Data

US 2003/0008071 A1 Jan. 9, 2003

(51) Int. Cl.[7] .................. C23C 14/02; C23C 14/12; B27N 43/04; B28B 3/02; B29C 59/02

(52) U.S. Cl. .................. 427/66; 427/69; 427/70; 264/109; 264/122; 264/319

(58) Field of Search ................ 427/66, 69, 70; 264/319, 325, 327, 331.22, 109, 122, 330–331.21

(56) References Cited

U.S. PATENT DOCUMENTS

| 4,356,429 A | 10/1982 | Tang |
| 4,539,507 A | 9/1985 | VanSlyke et al. |
| 4,720,432 A | 1/1988 | VanSlyke et al. |
| 4,769,292 A | 9/1988 | Tang et al. |

*Primary Examiner*—Michael Cleveland
(74) *Attorney, Agent, or Firm*—Raymond L. Owens

(57) ABSTRACT

A method of handling powders of organic materials in making an organic light-emitting device (OLED) is disclosed. The method includes forming solid pellets from powders of organic materials and using such pellets in a thermal physical vapor deposition source for making an organic layer on a structure which will form part of an OLED.

26 Claims, 9 Drawing Sheets

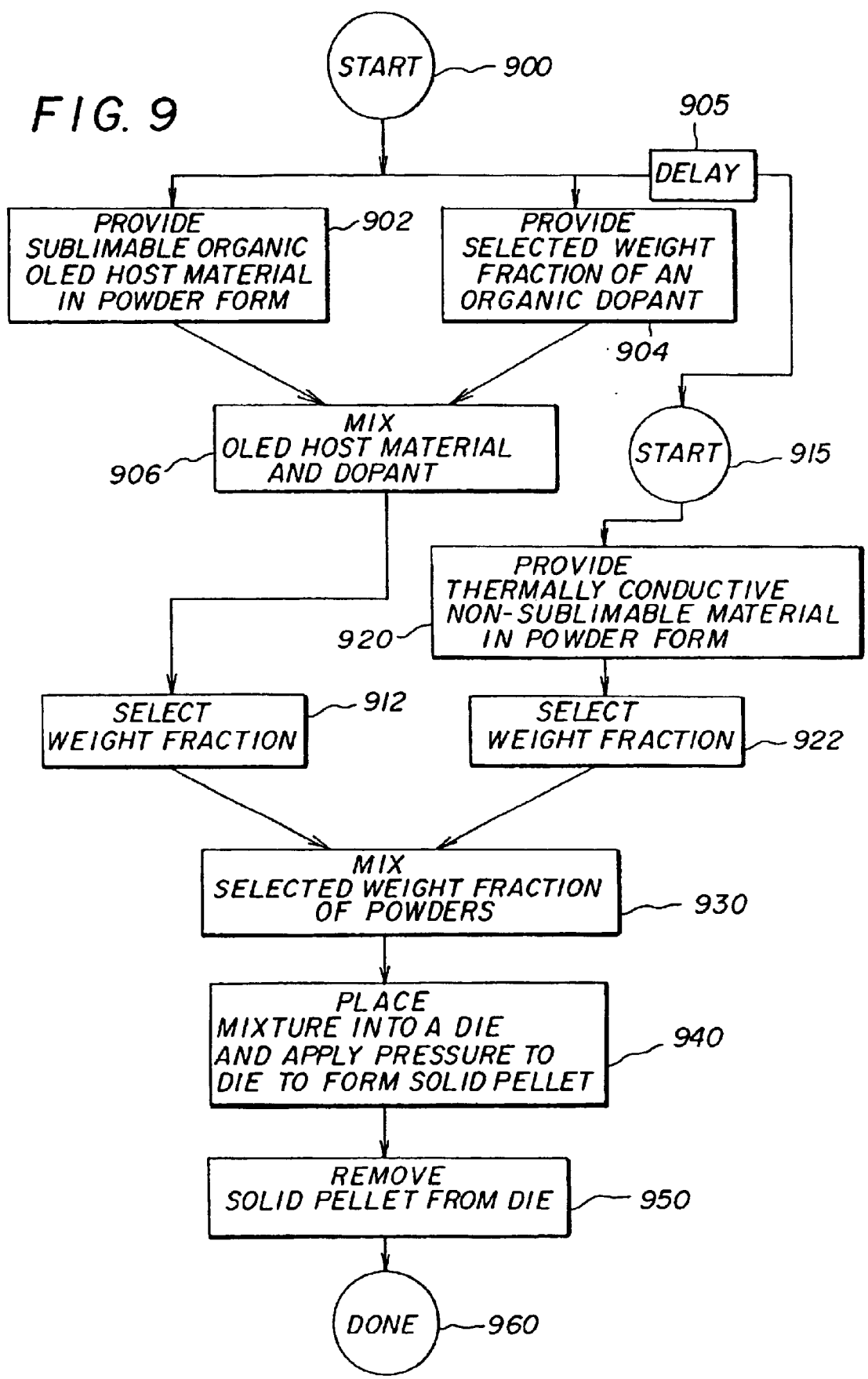

METHOD OF HANDLING ORGANIC MATERIAL IN MAKING AN ORGANIC LIGHT-EMITTING DEVICE

FIELD OF THE INVENTION

The present invention relates generally to a method of making an organic light-emitting device (OLED) and particularly to a method of forming solid pellets from powders of organic materials and using such pellets in thermal physical vapor deposition to make an organic layer on a structure which will form part of an OLED.

BACKGROUND OF THE INVENTION

An organic light-emitting device, also referred to as an organic electroluminescent device, can be constructed by sandwiching two or more organic layers between first and second electrodes.

In a passive matrix organic light-emitting device (OLED) of conventional construction, a plurality of laterally spaced light-transmissive anodes, for example indium-tin-oxide (ITO) anodes, are formed as first electrodes on a light-transmissive substrate such as, for example, a glass substrate. Two or more organic layers are then formed successively by vapor deposition of respective organic materials from respective sources, within a chamber held at reduced pressure, typically less than $10^{-3}$ Torr. A plurality of laterally spaced cathodes are deposited as second electrodes over an uppermost one of the organic layers. The cathodes are oriented at an angle, typically at a right angle, with respect to the anodes.

Such conventional passive matrix organic light-emitting devices are operated by applying an electrical potential (also referred to as a drive voltage) between appropriate columns (anodes) and, sequentially, each row (cathode). When a cathode is biased negatively with respect to an anode, light is emitted from a pixel defined by an overlap area of the cathode and the anode, and emitted light reaches an observer through the anode and the substrate.

In an active matrix organic light-emitting device (OLED), an array of anodes are provided as first electrodes by thin-film transistors (TFTs) which are connected to a respective light-transmissive portion. Two or more organic layers are formed successively by vapor deposition in a manner substantially equivalent to the construction of the aforementioned passive matrix device. A common cathode is deposited as a second electrode over an uppermost one of the organic layers. The construction and function of an active matrix organic light-emitting device is described in U.S. Pat. No. 5,550,066, the disclosure of which is herein incorporated by reference.

Organic materials, thicknesses of vapor-deposited organic layers, and layer configurations, useful in constructing an organic light-emitting device, are described, for example, in U.S. Pat. Nos. 4,356,429; 4,539,507; 4,720,432; and 4,769,292, the disclosures of which are herein incorporated by reference.

Organic materials useful in making OLEDs, for example organic hole-transporting materials, organic light-emitting materials predoped with an organic dopant, and organic electron-transporting materials can have relatively complex molecular structures with relatively weak molecular bonding forces, so that care must be taken to avoid decomposition of the organic material(s) during vapor deposition.

The aforementioned organic materials are synthesized to a relatively high degree of purity, and are provided in the form of powders, flakes, or granules. Such powders or flakes have been used heretofore for placement into a thermal physical vapor deposition source for forming a vapor by sublimation or vaporization of the organic material, the vapor condensing on a structure to provide an organic layer thereon.

Several problems have been observed in using organic powders, flakes, or granules in thermal physical vapor deposition:

(i) powders, flakes, or granules are difficult to handle because they can acquire electrostatic charges via a process referred to as triboelectric charging;

(ii) powders, flakes, or granules of organic materials generally have a relatively low physical density (expressed in terms of weight per unit volume) in a range from about 0.05 to about 0.2 $g/cm^3$, compared to a physical density of an idealized solid organic material of about 1 $g/cm^3$;

(iii) powders, flakes, or granules of organic materials have an undesirably low thermal conductivity, particularly when placed in a vapor deposition source which is disposed in a chamber evacuated to a reduced pressure as low as $10^{-6}$ Torr. Consequently, powder particles, flakes, or granules are heated only by radiative heating from a heated source, and by conductive heating of particles or flakes directly in contact with heated surfaces of the source. Powder particles, flakes, or granules which are not in contact with heated surfaces of the source are not effectively heated by conductive heating due to a relatively low particle-to-particle contact area; and (iv) powders, flakes, or granules can have a relatively high ratio of surface area/volume of such particles and a correspondingly high propensity to entrain air and/or moisture between particles under ambient conditions. Consequently, a charge of organic powders, flakes, or granules loaded into a vapor deposition source which is disposed in a chamber must be thoroughly outgased by preheating the source once the chamber has been evacuated to a reduced pressure. If outgasing is omitted or is incomplete, particles can be ejected from the source together with a vapor stream during vapor-depositing an organic layer on a structure. An OLED, having multiple organic layers, can be or can become functionally inoperative if such layers include particles or particulates.

Each one, or a combination, of the aforementioned aspects of organic powders, flakes, or granules can lead to nonuniform heating of such organic materials in physical vapor deposition sources with attendant spatially nonuniform sublimation or vaporization of organic material and can, therefore, result in potentially nonuniform vapor-deposited organic layers formed on a structure.

SUMMARY OF THE INVENTION

It is an object of the present invention to provide a method of handling organic material adaptable for making an organic layer on a structure which will form part of an organic light-emitting device (OLED).

It is another object of the present invention to provide a method of agglomerating organic powder into a solid pellet.

It is a further object of the invention to provide a method of making an organic layer from a solid pellet of organic material and on a structure which will form part of an OLED.

It is a still further object of the present invention to provide a method of agglomerating into a solid pellet a mixture of a sublimable organic material powder and a thermally conductive non-sublimable material powder.

In one aspect, the present invention provides a method of handling organic material adaptable for making an organic layer on a structure which will form part of an organic light-emitting device, comprising the steps of:

a) providing the organic material in a powder form;

b) placing such organic powder into a die and applying sufficient pressure to the organic powder in the die to cause the organic powder to agglomerate into a solid pellet; and c) removing the pellet from the die.

In another aspect, the present invention provides a method of making an organic layer from an organic material on a structure which will form part of an organic light-emitting device (OLED), comprising the steps of:

a) providing the organic material in a powder form;

b) placing such organic powder into a die and applying sufficient pressure to the organic powder in the die to cause the organic powder to agglomerate into a solid pellet;

c) removing the pellet from the die;

d) placing the pellet into a thermal physical vapor deposition source disposed in a chamber;

e) positioning the structure in the chamber and in a spaced relationship with respect to the source;

f) evacuating the chamber to a reduced pressure; and g) applying heat to the source to cause a portion of the pellet to sublime to provide a vapor of the organic material from which the organic layer is made on the structure.

ADVANTAGES

A feature of the present invention is that the method of agglomerating organic powder into a solid pellet can be accomplished with relatively simple tools and at a location remote from a location of use of such pellet in a vapor deposition apparatus.

Another feature of the present invention is that the method of agglomerating organic powder into a solid pellet substantially facilitates handling, transfer or shipping of organic material in and between different locations.

Another feature of the present invention is that a plurality of pellets of organic material, prepared by the method of the present invention, can be handled, transferred or shipped in a container having a significantly reduced volume with respect to a container for handling, transferring or shipping organic material in powder form and of comparable weight.

Another feature of the present invention is that a solid pellet of an OLED-material can be made by the method of the present invention wherein a powder of at least one OLED host-material and a powder of at least one organic dopant material are mixed or blended to provide a mixture prior to agglomerating the mixture into a solid pellet.

Another feature of the present invention is that the method of agglomerating powder into a solid pellet and the method of making an organic layer on a structure by vaporizing a portion of a solid pellet in a vapor deposition source substantially eliminates ejection of powder particles from the source and, accordingly, provides an organic layer substantially free from particulate inclusions.

Another feature of the present invention is that the method of agglomerating powder into a solid pellet can be tailored to provide a pellet having a shape selected to conform with a shape of a physical thermal vapor deposition source from which a portion of a pellet is vaporized to form an organic layer on a structure.

BRIEF DESCRIPTION OF THE DRAWINGS

FIGS. 4A–4F schematically indicate a sequence of process steps for forming a solid organic pellet from an organic powder material in a mold disposed in a die press in accordance with the present invention, wherein FIG. 4A shows the mold having organic powder material filled over a lower die;

FIG. 4B shows an upper die positioned into the mold and contacting an upper surface of the organic powder material;

FIG. 4C shows pressure being applied by the die press to the upper and lower die to cause the organic powder material to agglomerate into a solid pellet;

FIG. 4D shows the upper die removed from the mold;

FIG. 4E shows the mold removed from the die press and the lower die removed from the mold, with the pellet shown clinging to side surfaces of the mold; and FIG. 4F depicts a pellet plunger useful for removing the pellet from the mold and capturing the pellet in a compliant container;

FIGS. 5A–5E are illustrative examples of shapes of solid pellets which can be formed in the die press of FIGS. 4A–4D by selecting desired molds and corresponding lower and upper dies, wherein FIG. 5A depicts a circular pellet having two co-planar major surfaces;

FIG. 5B shows a circular pellet having one planar major surface and one opposing convex major surface;

FIG. 5C shows a circular pellet having two convex major surfaces;

FIG. 5D shows an elongated pellet having two co-planar major surfaces; and

FIG. 5E depicts an elongated pellet having one planar major surface and one opposing convex major surface;

FIG. 9 is a process flow chart indicating the steps of producing a solid pellet by firstly mixing a powder of a sublimable OLED host material with a powder of a sublimable organic dopant material, and by secondly mixing the host-dopant mixture with a powder of a thermally conductive and non-sublimable material, in accordance with another aspect of the present invention.

The terms "powder" and "in the form of a powder" are used herein to denote a quantity of individual particles which can be flakes, granules, or mixtures of varied particle shapes.

DETAILED DESCRIPTION OF THE INVENTION

Figure 1:
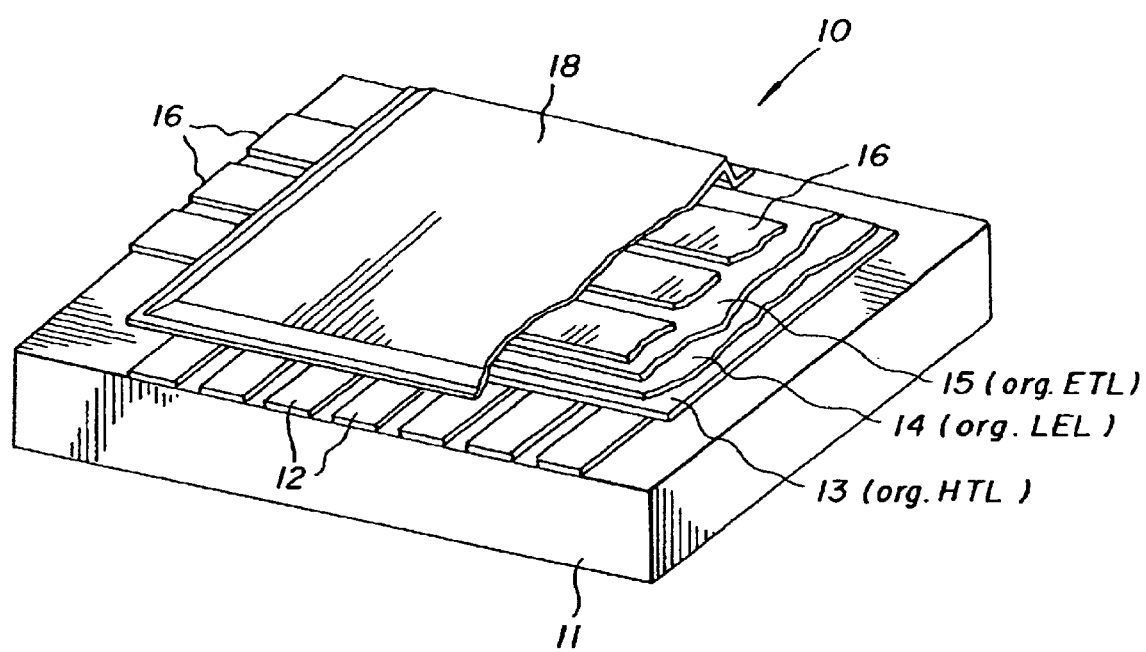
FIG. 1 is a schematic perspective view of a passive matrix organic light-emitting device having partially peeled-back elements to reveal various layers.

Turning to FIG. 1, a schematic perspective view of a passive matrix organic light-emitting device (OLED) 10 is shown having partially peeled-back elements to reveal various layers.

A light-transmissive substrate 11 has formed thereon a plurality of laterally spaced first electrodes 12 (also referred to as anodes). An organic hole-transporting layer (HTL) 13, an organic light-emitting layer (LEL) 14, and an organic electron-transporting layer (ETL) 15 are formed in sequence by a physical vapor deposition, as will be described in more detail hereinafter. A plurality of laterally spaced second electrodes 16 (also referred to as cathodes) are formed over the organic electron-transporting layer 15, and in a direction substantially perpendicular to the first electrodes 12. An encapsulation or cover 18 seals environmentally sensitive portions of the structure, thereby providing a completed OLED 10.

Figure 2:
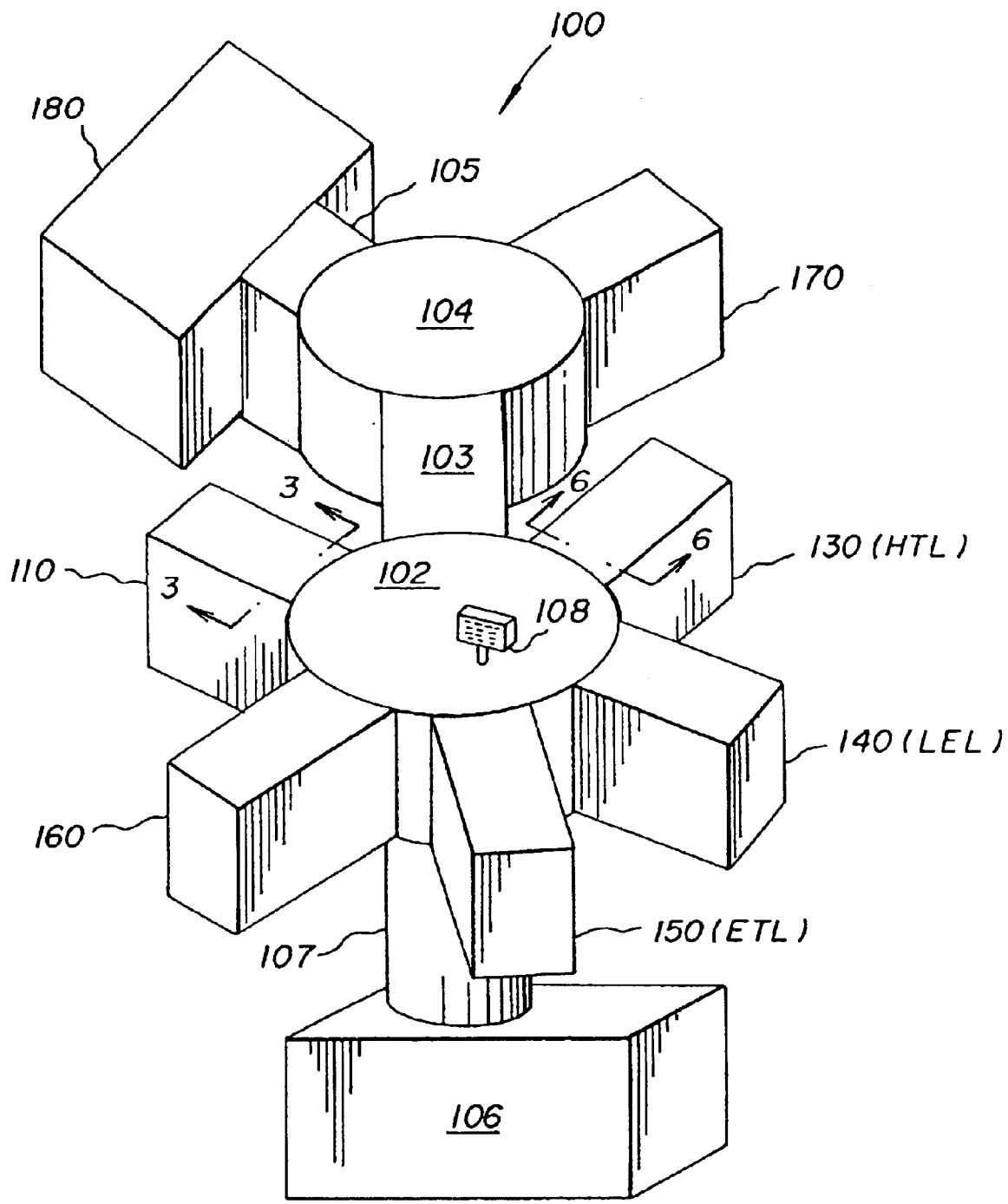
FIG. 2 is a schematic perspective view of an apparatus suitable for making a relatively large number of organic light-emitting devices (OLEDs) and having a plurality of stations extending from hubs.

Turning to FIG. 2, a schematic perspective view of an OLED apparatus 100 is shown which is suitable for making a relatively large number of organic light-emitting devices using automated or robotic means (not shown) for transporting or transferring substrates or structures among a plurality of stations extending from a buffer hub 102 and from a transfer hub 104. A vacuum pump 106 via a pumping port 107 provides reduced pressure within the hubs 102, 104, and within each of the stations extending from these hubs. A pressure gauge 108 indicates the reduced pressure within the system 100. The pressure can be in a range from about $10^{-3}$ to $10^{-6}$ Torr.

The stations include a load station 110 for providing a load of substrates or structures, a vapor deposition station 130 dedicated to forming organic hole-transporting layers (HTL), a vapor deposition station 140 dedicated to forming organic light-emitting layers (LEL), a vapor deposition station 150 dedicated to forming organic electron-transporting layers (ETL), a vapor deposition station 160 dedicated to forming the plurality of second electrodes (cathodes), an unload station 103 for transferring structures from the buffer hub 102 to the transfer hub 104 which, in turn, provides a storage station 170, and an encapsulation station 180 connected to the hub 104 via a connector port 105. Each of these stations has an open port extending into the hubs 102 and 104, respectively, and each station has a vacuum-sealed access port (not shown) to provide access to a station for cleaning, replenishing materials, and for replacement or repair of parts. Each station includes a housing which defines a chamber.

Figure 3:
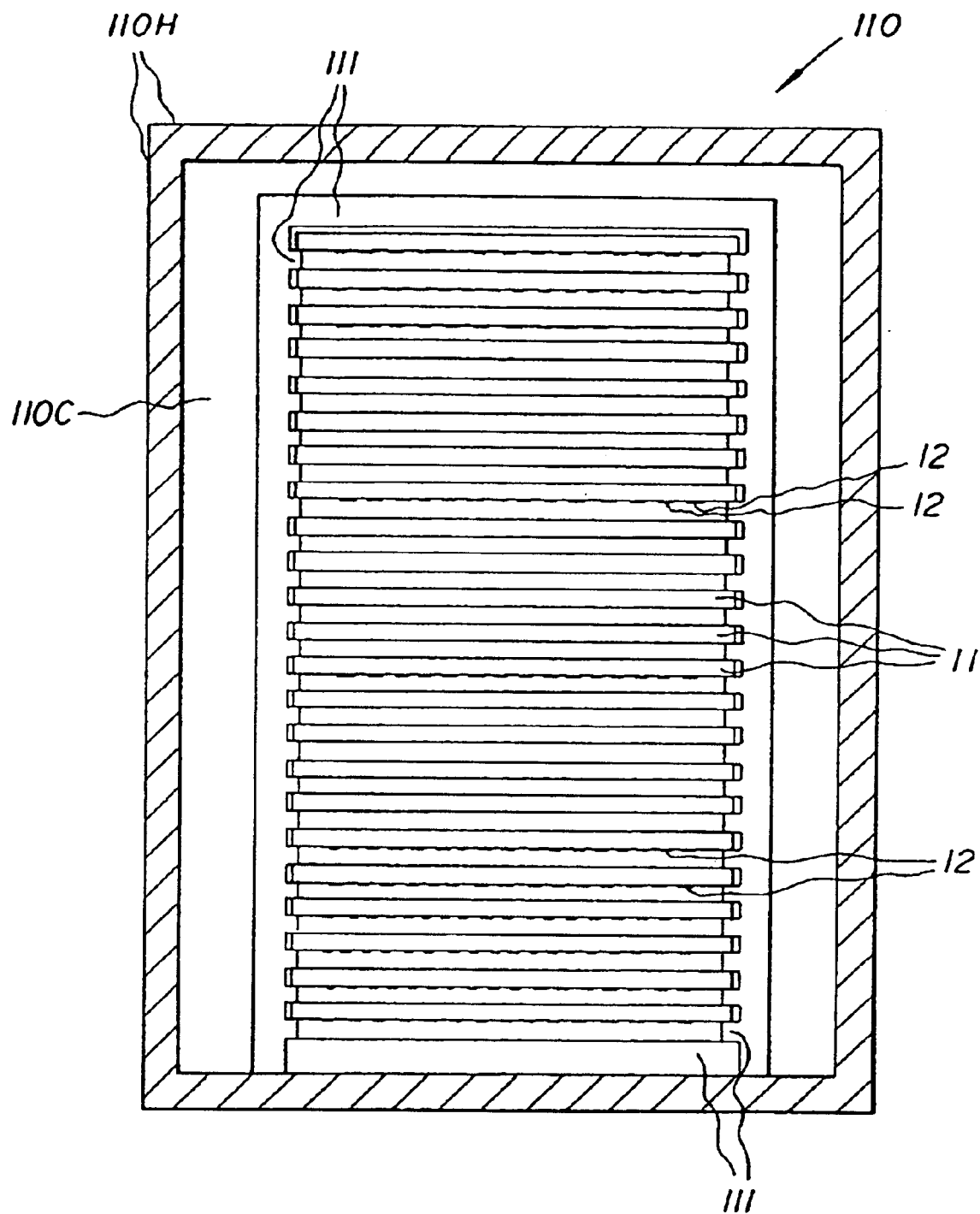
FIG. 3 is a schematic section view of a carrier containing a relatively large number of substrates or structures, and positioned in a load station of the system of FIG. 2 as indicated by section lines 3—3 in FIG. 2.

FIG. 3 is a schematic section view of the load station 110, taken along section lines 3—3 of FIG. 2. The load station 110 has a housing 110H which defines a chamber 110C. Within the chamber is positioned a carrier 111 designed to carry a plurality of substrates 11 having preformed first electrodes 12 (see FIG. 1). An alternative carrier 111 can be provided for supporting a plurality of active matrix structures. Carriers 111 can also be provided in the unload station 103 and in the storage station 170.

Turning to FIGS. 4A–4F, a sequence of process steps is indicated schematically for forming a solid pellet 13p of organic hole-transporting material by agglomerating a powder of organic hole-transporting material 13a in a mold 520 which is positioned in a die press 500. The die press 500 includes a fixed platform 512 and a movable platform 514 mounted on supports 516. Movable platform 514 can be driven by hydraulic means (not shown) and supports the mold 520 and a lower die 522.

Figure 4A:
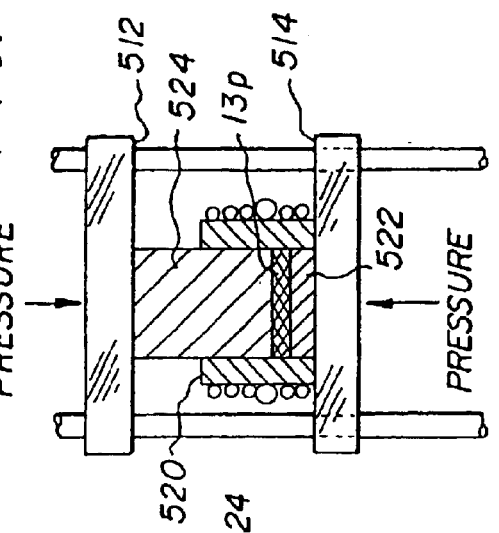

In FIG. 4A, powder, flakes, or granules of organic hole-transporting material 13a is filled in the mold 520 to a level 13b over the lower die 522. Heating coils 530 can heat the mold 520 from an ambient temperature of about 20° C. to a temperature of about 300° C., and at least one cooling coil 540 can cool a heated mold relatively rapidly, for example from a temperature of 300° C. to a temperature of 80° C. or to an ambient temperature. The mold can also be heated inductively.

Figure 4B:
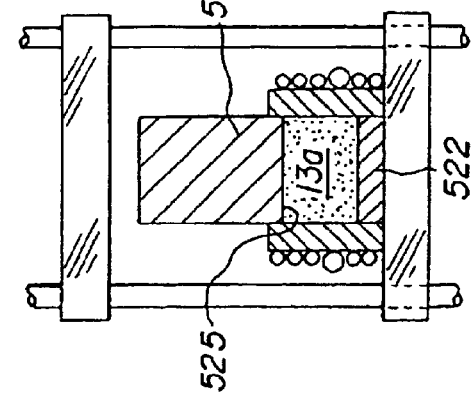

In FIG. 4B, an upper die 524 is positioned in the mold 520 to contact an upper surface (the fill-level 13b) of the organic powder 13a.

The interior surface 521 of the mold 520 is a polished surface, and at least the surface 523 of the lower die 522 and the surface 525 of the upper die 524 are polished surfaces. Taken together, the mold and the lower and upper dies are also referred to as a die in portions of this disclosure.

Figure 4D:
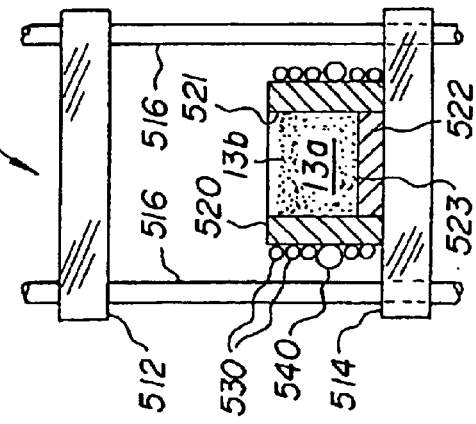
Figure 4C:
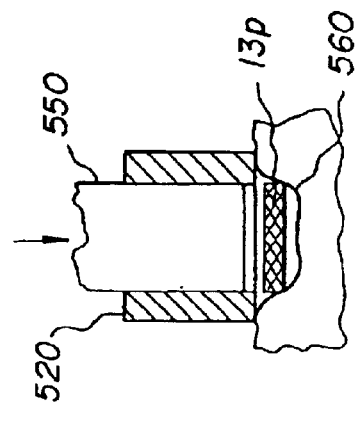

In FIG. 4C, the movable platform 514 is shown driven upwardly in a direction towards the fixed platform 512, and pressure is being applied by the die press 500 to the upper die and the lower die to cause the organic powder material 13a in the mold to agglomerate into a solid pellet 13p.

In FIG. 4D, the movable platform 514 has been lowered and the upper die 524 has been removed from the mold. If the mold was heated prior to or during formation of the pellet, the upper die 524 is removed from the mold upon cooling to a temperature in a range from 80° C. to 20° C. via the at least one cooling coil 540.

Figure 4E:
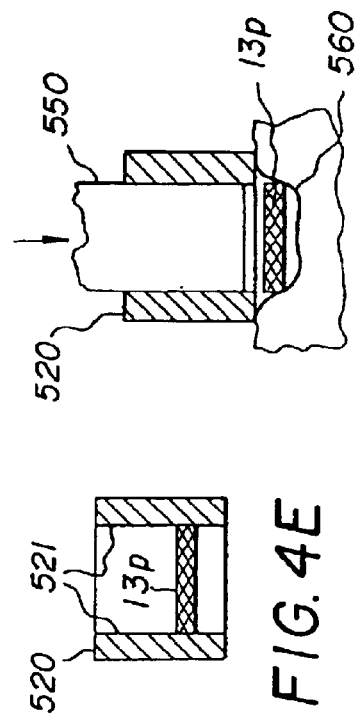

In FIG. 4E the mold 520 is shown removed from the die press 500, and the lower die 522 is removed from the mold 520. For illustrative purposes only, the pellet 13p of organic hole-transporting material is depicted clinging to the interior surface 521 of the mold.

Figure 4F:
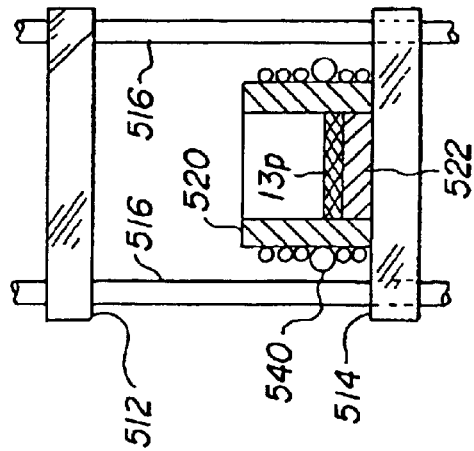

In FIG. 4F, a pellet plunger 550 is used for removing the solid pellet 13p from the mold. The pellet is captured in a compliant container 560 to minimize damage to the pellet.

Heating the mold 520 prior to or during application of pressure in the die press 500 can provide increased densification of a pellet during a shortened interval of pressure application or, alternatively, at a lower pressure. A preferred range of mold temperature extends from 20° C. to 300° C. The mold is cooled to a preferred temperature in a range from 80° C. to 20° C. prior to removing the pellet 13p from the mold 520 and preferably prior to removing the upper die 524 from the mold 520.

The powder, flakes, or granules of organic hole-transporting material 13a can include a mixture comprised of one or more hole-transporting host materials and of one or more organic dopant materials. A pellet 13p agglomerated from such a mixture can be placed into a thermal physical vapor deposition source for making a doped organic hole-transporting layer 13 (see FIG. 1) on a structure. Such doped layer or sub-layer has been shown to provide enhanced operational stability of light-emission of an OLED, as disclosed in commonly assigned U.S. patent application Ser. No. 09/875,646, filed on Jun. 6, 2001, now U.S. Pat. No. 6,565,996, by Tukaram K. Hatwar et al., and entitled "Organic Light-Emitting Device Having a Color-Neutral Dopant in a Hole-Transport Layer and/or in an Electron-Transport Layer", the disclosure of which is herein incorporated by reference.

Dopants which are effective in providing a vapor-deposited doped organic light-emitting layer on a structure have been disclosed in commonly assigned U.S. Pat. Nos. 4,769,292 and 5,294,870 to Ching W. Tang et al.

Predoped organic light-emitting materials, and doped organic light-emitting layers formed therefrom by vapor deposition, have been disclosed by Jiamnin Shi in commonly assigned U.S. patent application Ser. No. 09/574,949, filed May 19, 2000, now abandoned, and entitled "Predoped Materials for Making an Organic Light-Emitting Device", the disclosure of which is herein incorporated by reference.

A removable shroud (not shown) can be used to surround the lower die 522, the mold 520, and at least a portion of the upper die 524. The shroud, and thus the elements enclosed by it, can be evacuated to a reduced pressure. Alternatively, an inert gas can be introduced into the shroud to provide an inert, i.e., a chemically non-reactive, atmosphere within the shroud so that the organic powder (e.g., 13a) and the pellet (e.g. 13p) formed therefrom are protected from decomposition in cases where the mold is heated to a temperature of up to 300° C.

The die surfaces 523 and 525 can be planar surfaces. Alternatively, the surface 523 of the lower die 522, or the surface 525 of the upper die 524 can be a concave surface, or both surfaces 523 and 525 can have a concave shape, so that a solid pellet will have, respectively, co-planar major surfaces, one planar major surface and one convex major surface, or two convex major surfaces.

FIGS. 5A–5E are illustrative examples of shapes of solid pellets of organic materials which can be readily formed in the die press 500 of FIGS. 4A–4D by selecting molds 520 and corresponding upper and lower dies 524 and 522, respectively.

Figure 5A:
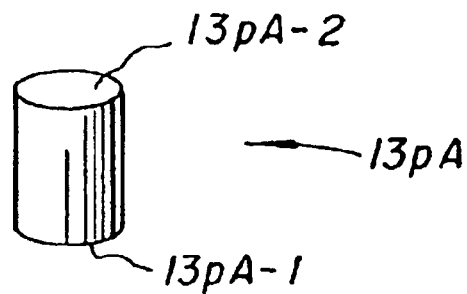

FIG. 5A depicts a circular pellet 13pA of organic hole-transporting material having two co-planar major surfaces 13pA-1 and 13pA-2.

Figure 5B:
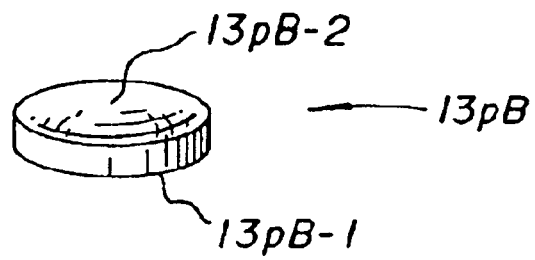

FIG. 5B shows a circular pellet 13pB having one planar major surface 13pB-1 and one opposing convex major surface 13pB-2.

Figure 5C:
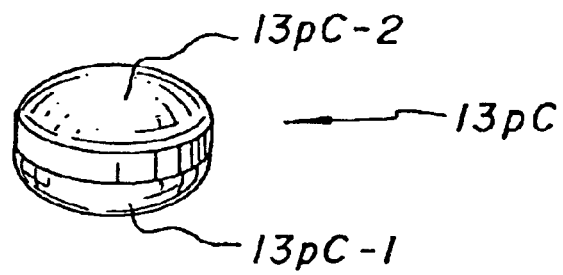

FIG. 5C shows a circular pellet 13pC having two convex major surfaces 13pC-1 and 13pC-2.

Figure 5D:
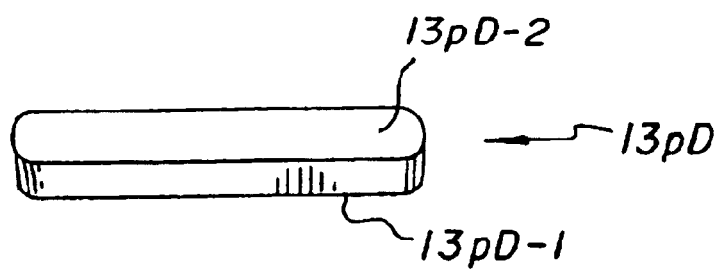

FIG. 5D shows an elongated pellet 13pD having two co-planar major surfaces 13pD-1 and 13pD-2.

Figure 5E:
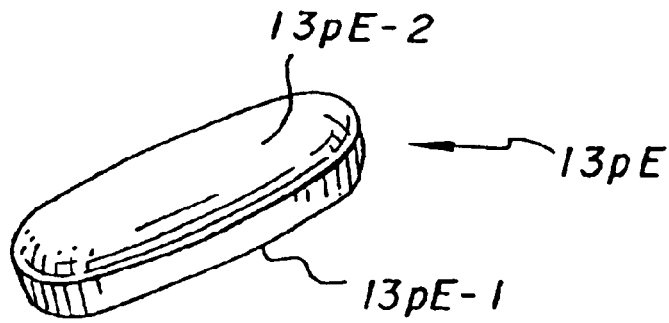

FIG. 5E depicts an elongated pellet 13pE having one planar major surface 13pE-1 and one opposing convex major surface 13pE-2.

A particular shape of a pellet is selected to be compatible with a particular vapor deposition source into which the pellet is to be placed. For example, a pellet or pellets 13pA (see FIG. 5A) may be used advantageously in a cylindrical vapor deposition source having a planar bottom surface. A pellet or pellets 13pE (see FIG. 5E) may be used advantageously in an elongated cylindrical tubular vapor deposition source, with a curvature of the convex major surface 13pE-2 approximately matching a radius of a cavity of such cylindrical tubular source.

Figure 6:
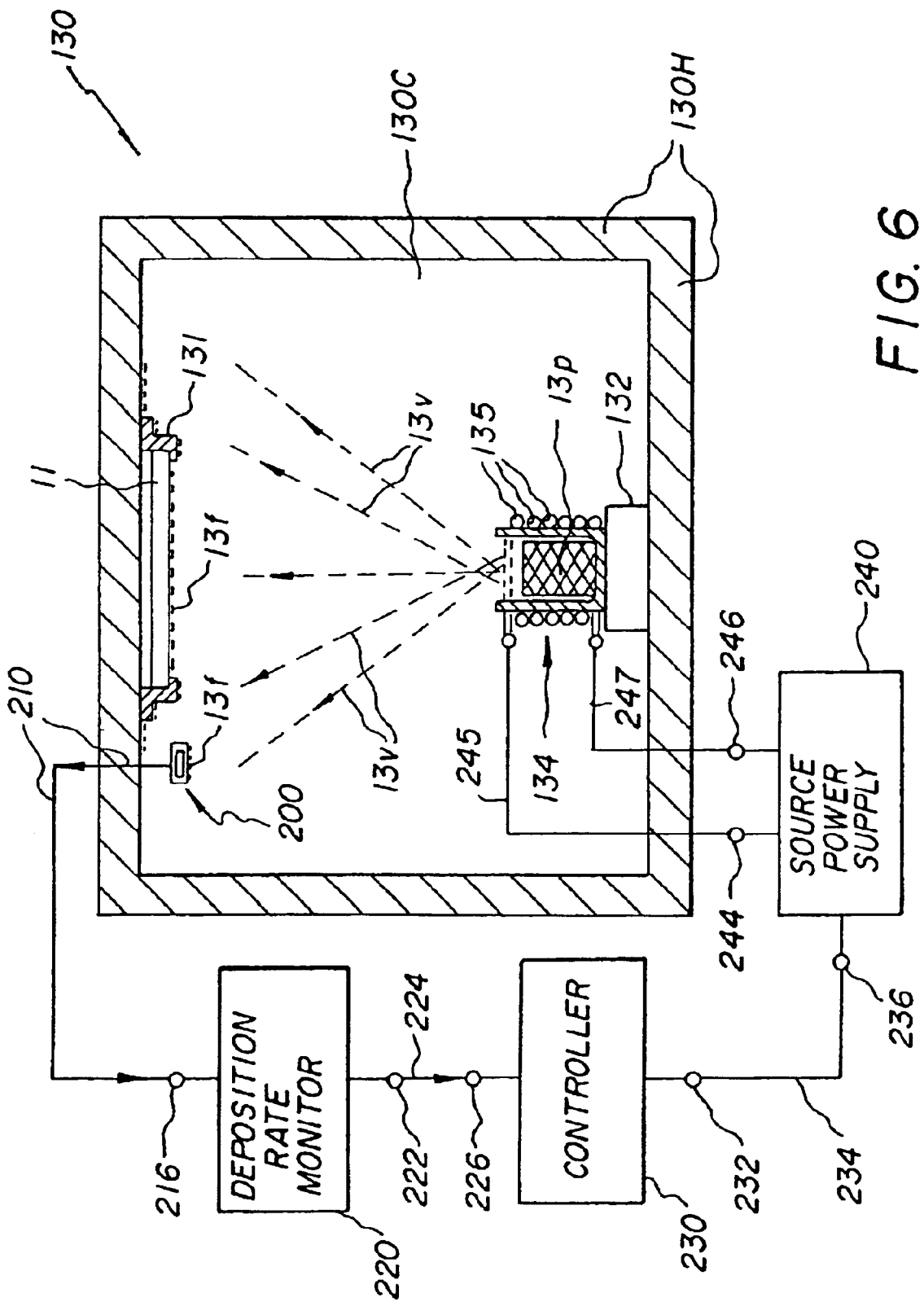
FIG. 6 is a schematic cross-sectional view of a vapor deposition station dedicated to forming an organic hole-transporting layer (HTL) on a structure in the apparatus of FIG. 2 as indicated by section lines 6—6 in FIG. 2, and showing a solid pellet of organic hole-transporting material placed in a vapor deposition source, in accordance with an aspect of the present invention.

Turning to FIG. 6, a schematic cross section view of the HTL vapor deposition station 130 is shown, taken along the section lines 6—6 of FIG. 2. A housing 130H defines a chamber 130C. A substrate or structure 11 (see FIG. 1) is held in a holder 131 which can be constructed as a mask frame. A vapor deposition source 134 is positioned on a thermally insulative support 132, the source 134 filled with a pellet 13p of organic hole-transporting material, for example, a pellet 13pA of FIG. 5A. The source 134 is heated by heating elements 135 which are connected via leads 245 and 247 to corresponding output terminals 244 and 246 of a source power supply 240.

When a source temperature is sufficiently elevated, a portion of the pellet will sublime or vaporize and thus provide a deposition zone 13v of vapor of organic hole-transporting material, indicated schematically by dashed lines and arrows.

The substrate or structure 11 as well as a conventional crystal mass-sensor 200 are positioned within the deposition zone, and each of these elements has an organic hole-transporting layer being formed thereon as indicated by the designation 13f, shown in dashed outline.

As is well known in the art, the crystal mass-sensor 200 is connected via a lead 210 to an input terminal 216 of a deposition rate monitor 220. The sensor 200 is part of an oscillator circuit provided in the monitor 220 and the circuit oscillates at a frequency which is approximately inversely proportional to a mass-loading of the crystal such as by a mass-loading provided by the layer 13f being formed. The monitor 220 includes a differentiating circuit which generates a signal proportional to a rate of mass-loading, i.e. proportional to a rate of deposition of the layer 13f. This signal is indicated by the deposition rate monitor 220, and is provided at an output terminal 222 thereof A lead 224 connects this signal to an input terminal 226 of a controller or amplifier 230 which provides an output signal at an output terminal 232. The latter output signal becomes an input signal to the source power supply 240 via lead 234 and input terminal 236.

Thus, if the vapor stream within the vapor deposition zone 13v is temporally stable, the mass build-up or growth of the layer 13f will proceed at a constant rate. The rate monitor 220 will provide a constant signal at output terminal 222, and the source power supply 240 will provide a constant current to the heating elements 135 of the source 134 via the leads 245 and 247, thereby maintaining the temporally stable vapor stream within the deposition zone. Under stable vapor deposition conditions, i.e. conditions of a constant deposition rate, a desired final thickness of an organic hole-transporting layer 13 (see FIG. 1) is achieved on the structure and on the crystal mass-sensor 200 during a fixed deposition duration, at which time the vapor deposition is terminated by terminating the heating of the source 134, or by positioning a shutter (not shown) over the source.

While a relatively simple crucible source 134 is shown in FIG. 6 for illustrative purposes, it will be appreciated that numerous other source configurations can be effectively used to provide evaporated or sublimed vapors of organic materials within a deposition zone. Useful sources are extended or linear physical vapor deposition sources disclosed by Robert G. Spahn in U.S. patent application Ser. No. 09/518,600, filed Mar. 3, 2000, now U.S. Pat. No. 6,237,529, and commonly assigned, the disclosure of which is herein incorporated by reference.

Particularly useful thermal physical vapor deposition sources are elongated tubular sources disclosed by Steven A. Van Slyke et al. in U.S. patent application Ser. No. 09/843,489, filed Apr. 26, 2001, now abandoned, and commonly assigned, the disclosure of which is herein incorporated by reference.

A single crystal mass-sensor 200 is depicted in FIG. 6 to preserve clarity of the drawing. It will be appreciated that monitoring and controlling formation of organic layers by physical vapor deposition in making OLEDs can be achieved by one or several movable crystal mass-sensors as disclosed by Michael A. Marcus et al. in U.S. patent application Ser. No. 09/839,886, filed Apr. 20, 2001, now U.S. Pat. No. 6,558,735, and commonly assigned, the disclosure of which is herein incorporated by reference.

Other apparatus for controlling the thickness of an organic layer in making an OLED is disclosed by Steven A. Van Slyke et al. in U.S. patent application Ser. No. 09/839,885, filed Apr. 20, 2001, now U.S. Pat. No. 6,513,451, and commonly assigned, the disclosure of which is herein incorporated by reference.

Figure 7:
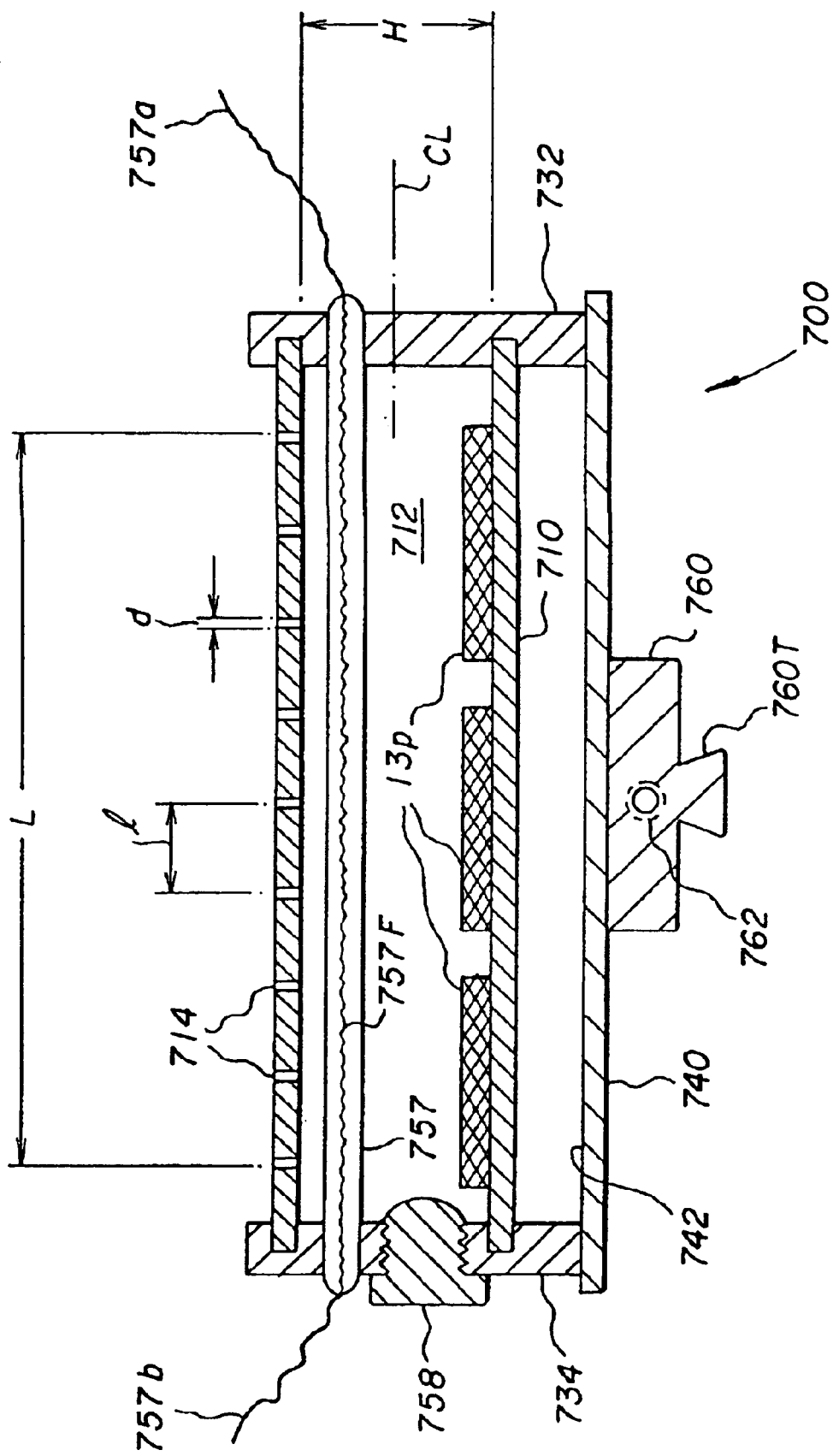
FIG. 7 is a partial cross-sectional view of a tubular vapor deposition source having a cavity in which three elongated solid pellets of organic hole-transporting material are placed.

Turning to FIG. 7, a schematic longitudinal section view of a cylindrical tubular thermal physical vapor deposition source assembly 700 is shown. The assembly includes a tubular source 710 having a center line CL. The tubular source 710 is supported by thermally and electrically insulative end caps 732 and 734 which also support a heat shield 740 having a heat-reflective surface 742.

The tubular source 710, together with the heat shield supports and end caps 732 and 734, defines a cavity 712 in which three elongated solid pellets 13p of organic hole-transporting material have been placed through a removable cavity seal 758.

The tubular source 710 includes a plurality of openings 714 which extend into the cavity 712. The openings 714 are arranged in a line of a length dimension L which is at least three times greater than a height dimension H of the tubular source (for a cylindrical tubular source, H corresponds to the diameter of the cavity 712). The openings 714 have a diameter d, and a center-to-center spacing 1.

A glide bracket 760 is attached to the heat shield 740 and has a dovetail-shaped tongue 760T, and a threaded bore 762. The threaded bore 762 would be engaged by a lead screw (not shown) so that the assembly 700 can be translated, moved, or scanned in a chamber with respect to a substrate or structure disposed in such chamber, as described in greater detail in the aforementioned Steven A. Van Slyke et al. U.S. patent application Ser. No. 09/843,489, filed Apr. 26, 2001, now abandoned, and commonly assigned, the disclosure of which is herein incorporated by reference.

When positioned in a chamber held at a reduced pressure of less than $10^{-3}$ Torr (for example, the chamber 130C of the HTL vapor deposition station 130 of FIG. 2), sublimation or evaporation of the organic hole-transporting material of the pellets 13p is actuated by providing electrical power to the filament 757F of the heat lamp 757 via lamp leads 757a and 757b. The heat lamp is disposed inside the cavity 712 and is supported by the heat shield supports and end caps 732, 734 at a position upwardly from the center line CL in a direction towards the openings 714 of the tubular source 710. Vapor clouds thus formed in the cavity 712 exit the cavity through the openings 714.

The elongated pellets 13p can be shaped similarly to the pellet 13pE of FIG. 5E, so that a convex major surface is in contact with an inner surface of the cylindrical tubular source 710, and a planar major surface of the pellet faces upwardly toward the heat lamp 757.

While two examples of vapor deposition sources have been shown in the drawings (FIG. 6 and FIG. 7), it will be appreciated that the inventive method of handling organic materials by providing agglomerated solid pellets, and by using such pellets for making OLEDs, is applicable in varied thermal physical vapor deposition sources and systems.

In FIGS. 4A–4F, FIGS. 5A–5E, FIG. 6, and FIG. 7, the methods of making and using solid pellets have been described with respect to organic hole-transporting materials and pellets 13p made therefrom. The method of the invention includes handling of doped or undoped organic light-emitting materials and of doped or undoped organic electron-transporting materials to provide corresponding solid pellets for making a doped or undoped organic light-emitting layer and a doped or undoped organic electron-transporting layer, respectively, on a structure, such as a layer 14 (LEL) and a layer 15 (ETL) shown in FIG. 1 and made in respective vapor deposition stations 140 (LEL) and 150 (ETL) of the OLED apparatus 100 of FIG. 2.

Figure 8:
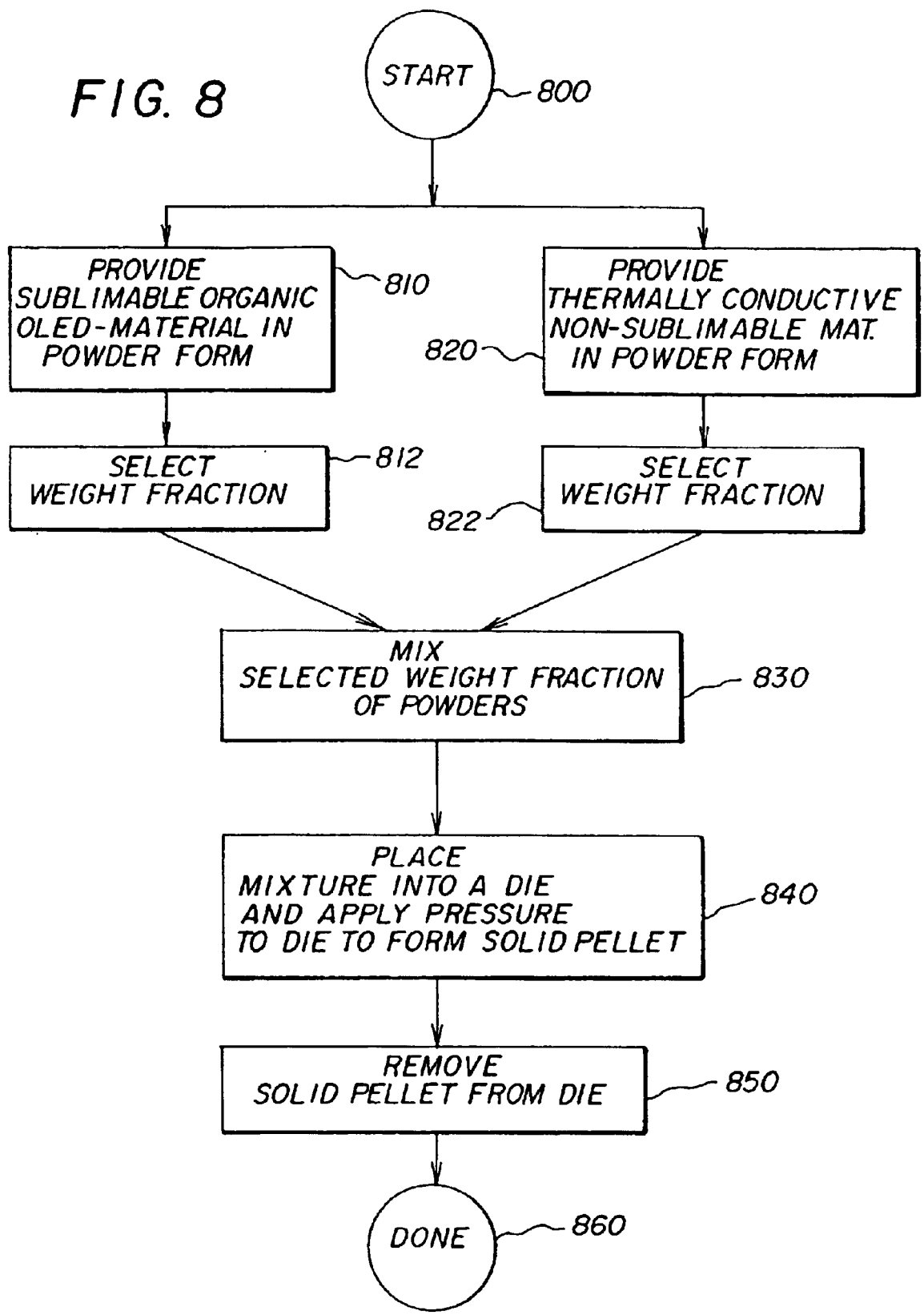
FIG. 8 is a process flow chart indicating the steps of producing a solid pellet from a mixture of a powder of a sublimable organic material and a powder of a thermally conductive and non-sublimable material, in accordance with another aspect of the present invention.

FIG. 8 is a process flow chart which indicates the steps of producing a solid pellet from a mixture of a powder of a sublimable organic OLED material and a powder of a non-sublimable and thermally conductive material.

The process starts at step 800. In a step 810, a sublimable organic OLED-material is provided in powder form. Sublimable organic materials include organic hole-transporting materials, doped or undoped organic light-emitting materials, and doped or undoped organic electron-transporting materials.

In a step 812, a weight fraction (of a mixture to be formed) of the organic OLED-material powder is selected. A preferred weight fraction of the organic OLED-material powder is in a range from 50–99 percent.

In a step 820, a thermally conductive and non-sublimable material is provided in powder form. Preferred thermally conductive and non-sublimable materials include powders of carbon, silicon, silicon dioxide, metals, metal oxides, and metal alloys.

In a step 822, a weight fraction (of a mixture to be formed) of the thermally conductive and non-sublimable material powder is selected in a preferred range from 1.0–50 percent.

In a step 830, the selected weight fractions of the sublimable organic OLED-material powder and the thermally conductive and non-sublimable material powder are mixed or blended to provide a relatively uniform mixture.

In a step 840, the mixture (or a portion of the mixture) is placed into a die, and sufficient pressure is applied to the mixture in the die to cause the mixture to agglomerate into a solid pellet. The die can be heated to a temperature selected to be in a range from 20° C. to 300° C. prior to or during applying sufficient pressure to the mixture in the die.

In a step 850, the solid pellet is removed from the die. If the die was heated, the die is cooled to a temperature in a range from 80° C. to 20° C. prior to removing the solid pellet from the die. The process is now done, as indicated at 860.

The pellet or pellets can be placed into a thermal physical vapor deposition source disposed in a chamber to make an organic layer on a structure which will form part of an organic light-emitting device (OLED).

FIG. 9 is a process flow chart which indicates the steps of producing a solid pellet by firstly mixing a powder of a sublimable OLED host material with a powder of a sublimable organic dopant material, and by secondly mixing the host-dopant mixture with a powder of a thermally conductive and non-sublimable material.

The process starts at step 900. In a step 902, a sublimable OLED host material is provided in powder form. Sublimable OLED host materials include organic hole-transporting host materials, organic light-emitting host materials, and organic electron-transporting host materials.

In a step 904, a selected weight fraction of a powder of a sublimable organic dopant material is provided. The selected weight fraction depends upon the OLED host material to be doped, the class of dopant or classes of dopants to be chosen, and a concentration of dopant(s) to be achieved in the host material so that a layer to be made on a structure will have a predetermined dopant concentration in the host material.

In a step 906, the selected weight fraction of the organic dopant material is mixed or blended with the organic host material to provide a first mixture.

Following a delay 905 of the start command 900, a delayed start command 915 initiates providing a thermally conductive and non-sublimable material in powder form in a step 920. Preferred thermally conductive and non-sublimable materials include powders of carbon, silicon, silicon dioxide, metals, metal oxides, and metal alloys.

In a step 912, a weight fraction (of a second mixture to be formed) of the first host-dopant mixture is selected. A preferred weight fraction of this organic mixture is in a range from 50–99 percent.

In a step 922, a weight fraction (of the second mixture to be formed) of the thermally conductive and non-sublimable material powder is selected in a preferred range from 1–50 percent.

In a step 930, the selected weight fractions of the first organic host-dopant powder mixture and the thermally conductive and non-sublimable material powder are mixed or blended to provide a relatively uniform second mixture.

In a step 940, the second mixture (or a portion of the second mixture) is placed into a die, and sufficient pressure is applied to the second mixture in the die to cause the second mixture to agglomerate into a solid pellet. The die can be heated to a temperature selected to be in a range from 20° C. to 300° C. prior to or during applying sufficient pressure to the second mixture in the die.

In a step 950, the solid pellet is removed from the die. If the die was heated, the die is cooled to a temperature in a range from 80° C. to 20° C. prior to removing the solid pellet from the die. The process is now done, as indicated at 960.

The pellet or pellets can be placed into a thermal physical vapor deposition source disposed in a chamber to make a doped organic layer on a structure which will form part of an organic light-emitting device (OLED).

A doped organic hole-transporting layer or sub-layer and a doped organic electron-transporting layer or sub-layer can provide enhanced operational stability of light emission of an OLED, and a doped organic light-emitting layer can provide enhanced operational stability of light emission of an OLED as well as enhanced luminous efficiency of light emission within a region of the visible spectrum. Doped layers or sublayers also provide OLEDs which can be operated at reduced drive voltage levels.

One or more organic host materials in powder form and one or more organic dopant materials in powder form can be mixed or blended to provide a first mixture of organic materials which is then mixed or blended with the thermally conductive and non-sublimable material powder to provide a second mixture from which a solid pellet is formed.

The invention has been described in detail with particular reference to certain preferred embodiments thereof, but it will be understood that variations and modifications can be effected within the spirit and scope of the invention.

Parts List 10 organic light-emitting device (OLED)
11 substrate or structure
12 first electrodes
13 organic hole-transporting layer (HTL)
13a organic hole-transporting material powder or flakes
13b level of organic hole-transporting material powder
13p pellet of organic hole-transporting material
13v deposition zone of vapor of organic hole-transporting material
13f organic hole-transporting layer being formed
13pA circular or cylindrical pellet of organic hole-transporting material
13pA-1 planar major surface
13pA-2 planar major surface
13pB circular pellet of organic hole-transporting material
13pB-1 planar major surface
13pB-2 convex major surface
13pC circular pellet of organic hole-transporting material
13pC-1 convex major surface
13pC-2 convex major surface
13pD elongated pellet of organic hole-transporting material
13pD-1 planar major surface
13pD-2 planar major surface
13pE elongated pellet of organic hole-transporting material
13pE-1 planar major surface
13pE-2 convex major surface
14 organic light-emitting layer (LEL)
15 organic electron-transporting layer (ETL)
16 second electrodes
18 encapsulation or cover

Parts List (con't)

100 OLED manufacturing system
102 buffer hub
103 unload station
104 transfer hub
105 connector port
106 vacuum pump
107 pumping port
108 pressure gauge
110 load station
110C chamber
110H housing
111 carrier (for substrates or structures)
130 vapor deposition station (organic HTL)
130C chamber
130H housing
131 holder and/or mask frame
132 thermally insulative support
134 source
135 heating element(s)
140 vapor deposition station (organic LEL)
150 vapor deposition station (organic ETL)
160 vapor deposition station (second electrodes)
170 storage station
180 encapsulation station

Parts List (con't)

200 crystal mass-sensor
210 lead
216 input terminal
220 deposition rate monitor
222 output terminal
224 lead
226 input terminal
230 controller or amplifier
232 output terminal
234 lead
236 input terminal
240 source (heating) power supply
244 output terminal
245 lead
246 output terminal
247 lead
500 die press
512 fixed platform
514 movable platform
516 supports
520 mold
521 polished interior surface
522 lower die
523 polished surface
524 upper die
525 polished surface

Parts List (con't)

530 heating coils
540 cooling coil
550 pellet plunger
560 compliant container
700 cylindrical thermal physical vapor deposition source assembly
710 tubular source
712 cavity
714 openings (extending into cavity)
732 heat shield support and end cap
734 heat shield support and end cap
740 heat shield
742 heat-reflective surface
757 heat lamp
757F filament
757a lamp lead
757b lamp lead
758 cavity seal
760 glide bracket
760T tongue
762 threaded bore
800 start of process
810 providing sublimable organic OLED-material in powder form
812 selecting weight fraction of organic OLED-material powder
820 providing thermally conductive and non-sublimable material in powder form

Parts List (con't)

822 selecting weight fraction of thermally conductive and non-sublimable material powder
830 mixing selected weight fractions of powders to provide a mixture
840 placing mixture into a die and applying pressure to the die to form a solid pellet
850 removing the solid pellet from the die
860 completion of process start of process
900 providing sublimable organic OLED host material in powder
902 form
904 providing selected weight fraction of sublimable organic dopant material in powder form
905 delaying start command 900
906 mixing organic OLED host material and organic dopant material to provide a first mixture 912 selecting a weight fraction of the first mixture
915 delayed start
920 providing thermally conductive and non-sublimable material in powder form
922 selecting weight of thermally conductive and non-sublimable material powder
930 mixing selected weight fractions of powders to provide a second mixture
940 placing second mixture into a die and applying pressure to the die to form a solid pellet
950 removing the solid pellet from the die
960 completion of process Parts List (con't)

CL center line of a tubular source
d diameter of openings
H height dimension of cavity
L length dimension of a line of openings
l center-to-center spacing between openings

What is claimed is:

1. A method of handling sublimable organic material adaptable for making an organic layer on a structure which will form part of an organic light-emitting device, comprising the steps of:
   a) providing the sublimable organic material in a powder form;
   b) providing a thermally conductive material in a powder form;
   c) forming a mixture of selected portions of the sublimable organic material powder and the thermally conductive material powder;
   d) placing such mixture into a die and applying sufficient pressure to the mixture in the die to cause the mixture of powders to agglomerate into a solid pellet;
   e) removing the pellet from the die and placing the pellet in a vacuum chamber; and
   f) applying heat to the pellet in the vacuum chamber to sublime the organic material but not the thermally conductive material to form the layer on the structure.

2. The method of claim 1 wherein step a) includes providing organic hole-transporting material, organic light-emitting material, or organic electron-transporting material.

3. The method of claim 2 wherein step a) further includes providing at least one organic hole-transporting host material and at least one organic dopant material therefor, at least one organic light-emitting host material and at least one organic dopant material therefor, or at least one organic electron-transporting host material and at least one organic dopant material therefor.

4. The method of claim 1 wherein step b) includes providing a material selected from the group consisting of carbon, silicon, silicon dioxide, metals, metal oxides, and metal alloys.

5. The method of claim 1 wherein step c) includes selecting a portion of the sublimable organic material powder in a range from 50 to 99 weight percent and selecting a portion of the thermally conductive material powder in a range from 1.0 to 50 percent weight percent.

6. The method of claim 1 wherein step d) includes placing the mixture into a die having at least one concave major surface to provide the solid pellet with at least one corresponding convex major surface.

7. The method of claim 1 wherein step d) further includes selecting a temperature of the die in a range from 20° C. to 300° C. prior to or during applying sufficient pressure to the mixture in the die.

8. The method of claim 7 wherein step e) further includes reducing the temperature of the die to a range from 80° C. to 20° C. prior to removing the pellet from the die.

9. A method of making an organic layer from an organic material on a structure which will form part of an organic light-emitting device, comprising the steps of:
   a) providing a sublimable organic material in a powder form;
   b) providing a thermally conductive material in a powder form;
   c) forming a mixture of selected portions of the sublimable organic material powder and the thermally conductive material powder;
   d) placing such mixture into a die and applying sufficient pressure to the mixture in the die to cause the mixture of powders to agglomerate into a solid pellet;
   e) removing the pellet from the die;
   f) placing the pellet into a thermal physical vapor deposition source disposed in a chamber;
   g) positioning the structure in the chamber and in a spaced relationship with respect to the source;
   h) evacuating the chamber to a reduced pressure; and
   i) applying heat to the source to cause a portion of the pellet to sublime to provide a vapor of the organic material but not the thermally conductive material from which the organic layer is made on the structure.

10. The method of claim 9 wherein step a) includes providing organic hole-transporting material, organic light-emitting material, or organic electron-transporting material.

11. The method of claim 10 wherein step a) further includes providing at least one organic hole-transporting host material and at least one organic dopant material therefor, at least one organic light-emitting host material and at least one organic dopant material therefor, or at least one organic electron-transporting host material and at least one organic dopant material therefor.

12. The method of claim 9 wherein step b) includes providing a material selected from the group consisting of carbon, silicon, silicon dioxide, metals, metal oxides, and metal alloys.

13. The method of claim 9 wherein step c) includes selecting a portion of the sublimable organic material powder in a range from 50 to 99 weight percent and selecting a portion of the thermally conductive material powder in a range from 1 to 50 weight percent.

14. The method of claim 9 wherein step f) includes placing more than one pellet into the thermal physical vapor deposition source.

15. A method of handling sublimable organic material adaptable for making an organic layer on a structure which will form part of an organic light-emitting device, comprising the steps of:
   a) providing at least one sublimable organic host material in a powder form;
   b) providing at least one sublimable organic dopant material in a powder form and as a selected weight fraction of the organic host material;
   c) forming a first mixture of the at least one organic host material and the at least one organic dopant material;
   d) providing a thermally conductive and non-sublimable material in a powder form;

e) forming a second mixture of selected portions of the first mixture and the thermally conductive material powder;

f) placing such second mixture into a die and applying sufficient pressure to the second mixture in the die to cause the second mixture of powders to agglomerate into a solid pellet; and g) removing the pellet from the die.

16. The method of claim 15 wherein step a) includes providing at least one organic hole-transporting host material, at least one organic light-emitting host material, or at least one organic electron-transporting host material.

17. The method of claim 15 wherein step d) includes providing a material selected from the group consisting of carbon, silicon, silicon dioxide, metals, metal oxides, and metal alloys.

18. The method of claim 15 wherein step e) includes selecting a portion of the first mixture in a range from 50 to 99 weight percent and selecting a portion of the thermally conductive material powder in a range from 1.0 to 50 percent weight percent.

19. The method of claim 15 wherein step f) includes placing the second mixture into a die having at least one concave major surface to provide the solid pellet with at least one corresponding convex major surface.

20. The method of claim 15 wherein step f) further includes selecting a temperature of the die in a range from 20° C. to 300° C. prior to or during applying sufficient pressure to the second mixture in the die.

21. The method of claim 20 wherein step g) further includes reducing the temperature of the die to a range from 80° C. to 20° C. prior to removing the pellet from the die.

22. A method of making an organic layer from an organic material on a structure which will form part of an organic light-emitting device, comprising the steps of:

a) providing at least one sublimable organic host material in a powder form;

b) providing at least one sublimable organic dopant material in a powder form and as a selected weight fraction of the organic host material;

c) forming a first mixture of the at least one organic host material and the at least one organic dopant material;

d) providing a thermally conductive material in a powder form;

e) forming a second mixture of selected portions of the first mixture and the thermally conductive material powder;

f) placing such second mixture into a die and applying sufficient pressure to the second mixture in the die to cause the second mixture of powders to agglomerate into a solid pellet;

g) removing the pellet from the die;

h) placing the pellet into a thermal physical vapor deposition source disposed in a chamber;

i) positioning the structure in the chamber and in a spaced relationship with respect to the source;

j) evacuating the chamber to a reduced pressure; and k) applying heat to the source to cause a portion of the pellet to sublime to provide a vapor of the first mixture of organic materials but not the thermally conductive material from which the organic layer is made on the structure.

23. The method of claim 22 wherein step a) further includes providing at least one organic hole-transporting host material, at least one organic light-emitting host material, or at least one organic electron-transporting host material.

24. The method of claim 23 wherein step b) further includes providing at least one organic dopant material selected as a dopant for the at least one organic hole-transporting host material, at least one organic dopant material selected as a dopant for the at least one organic light-emitting host material, or at least one organic dopant material selected as a dopant for the at least one organic electron-transporting host material.

25. The method of claim 22 wherein step d) includes providing a material selected from the group consisting of carbon, silicon, silicon dioxide, metals, metal oxides, and metal alloys.

26. The method of claim 22 wherein step b) includes placing more than one pellet into the thermal physical vapor deposition source.

* * * * *